United States Patent
Ushijima

(10) Patent No.: US 10,462,939 B2
(45) Date of Patent: Oct. 29, 2019

(54) SEMICONDUCTOR DEVICE

(71) Applicant: Mitsubishi Electric Corporation, Tokyo (JP)

(72) Inventor: Koichi Ushijima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/533,394

(22) PCT Filed: Jan. 22, 2015

(86) PCT No.: PCT/JP2015/051708
§ 371 (c)(1),
(2) Date: Jun. 6, 2017

(87) PCT Pub. No.: WO2016/117094
PCT Pub. Date: Jul. 28, 2016

(65) Prior Publication Data
US 2017/0332522 A1   Nov. 16, 2017

(51) Int. Cl.
*F28F 3/06* (2006.01)
*F28F 3/10* (2006.01)
(Continued)

(52) U.S. Cl.
CPC ......... *H05K 7/20927* (2013.01); *F28F 9/026* (2013.01); *H01L 23/473* (2013.01);
(Continued)

(58) Field of Classification Search
CPC ....... G06F 1/181–182; H05K 7/20218–20381; H05K 7/20409–20418;
(Continued)

(56) References Cited

U.S. PATENT DOCUMENTS 5,998,240 A * 12/1999 Hamilton ............. H01L 23/473
257/714
6,789,613 B1 * 9/2004 Ozaki ..................... F01P 3/18
165/132
(Continued)

FOREIGN PATENT DOCUMENTS

CN 103871984 A 6/2014
JP H02-271560 A 11/1990
(Continued)

OTHER PUBLICATIONS

JP Office Action dated Nov. 28, 2017, from corresponding JP Appl No. 2016-570431, with English translation, 8 pp.
(Continued)

*Primary Examiner* — Anthony M Haughton
*Assistant Examiner* — Razmeen Gafur
(74) *Attorney, Agent, or Firm* — Studebaker & Brackett PC

(57) ABSTRACT

A semiconductor device includes a cooling jacket having an inlet for coolant and an outlet for the coolant, a base plate, a first semiconductor element provided on the base plate, a second semiconductor element provided on the base plate, a first fin provided directly under the first semiconductor element on a back surface of the base plate and placed within the cooling jacket, a second fin provided directly under the second semiconductor element on the back surface of the base plate and placed within the cooling jacket, and a separator provided within the cooling jacket to divide the coolant entering the cooling jacket through the inlet into portions respectively cooling the first fin and the second fin.

16 Claims, 6 Drawing Sheets

(51) Int. Cl.
- *F28F 3/12* (2006.01)
- *F28F 9/02* (2006.01)
- *H05K 7/20* (2006.01)
- *H01L 23/473* (2006.01)

(52) U.S. Cl.
CPC ..... *H05K 7/20272* (2013.01); *H05K 7/20281* (2013.01); *F28F 3/06* (2013.01); *F28F 3/10* (2013.01); *F28F 3/12* (2013.01); *H01L 2224/32225* (2013.01)

(58) Field of Classification Search
CPC ... H05K 7/20009–202; H05K 7/20927; H05K 7/20272; H05K 7/20281; H01L 23/367–3677; H01L 23/473; H01L 23/46–467; H01L 2224/32225; F28F 9/026; F28F 3/06; F28F 3/10; F28F 3/12
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 8,162,035 | B2* | 4/2012 | Behrens | F28F 3/12 165/80.4 |
| 9,064,846 | B2* | 6/2015 | Nagai | H01L 23/473 |
| 2002/0040776 | A1* | 4/2002 | Kokubunji | F28D 1/0443 165/140 |
| 2002/0185260 | A1* | 12/2002 | Calaman | F28F 3/022 165/80.4 |
| 2005/0006963 | A1* | 1/2005 | Takenaka | B60K 1/00 310/52 |
| 2005/0094373 | A1* | 5/2005 | Weber | F28D 15/0266 361/699 |
| 2006/0048921 | A1* | 3/2006 | Usui | F28D 7/1684 165/109.1 |
| 2006/0196632 | A1* | 9/2006 | Kudo | F28D 20/02 165/10 |
| 2006/0219387 | A1* | 10/2006 | Atarashi | H01L 23/3672 165/80.4 |
| 2006/0219388 | A1* | 10/2006 | Terakado | G06F 1/203 165/80.4 |
| 2006/0254752 | A1* | 11/2006 | Narakino | F28D 1/0316 165/80.4 |
| 2008/0026284 | A1 | 1/2008 | Fuji | |
| 2009/0080156 | A1* | 3/2009 | Ahuja | G06F 1/20 361/697 |
| 2010/0090336 | A1* | 4/2010 | Yoshida | H01L 23/473 257/717 |
| 2010/0154445 | A1* | 6/2010 | Sullivan | B60H 1/00414 62/115 |
| 2010/0208427 | A1* | 8/2010 | Horiuchi | H05K 7/20927 361/699 |
| 2011/0206968 | A1* | 8/2011 | Nishimura | H01M 10/647 429/120 |
| 2012/0087088 | A1* | 4/2012 | Killion | F28D 15/0266 361/697 |
| 2012/0111550 | A1* | 5/2012 | Kuno | H01L 23/427 165/181 |
| 2014/0091453 | A1* | 4/2014 | Mori | H01L 23/473 257/712 |
| 2014/0158324 | A1 | 6/2014 | Tochiyama et al. | |
| 2014/0190668 | A1* | 7/2014 | Joshi | H01L 23/4735 165/104.33 |
| 2014/0284029 | A1* | 9/2014 | Yoshida | F28F 3/02 165/104.31 |
| 2014/0355212 | A1* | 12/2014 | Campbell | H05K 7/20236 361/699 |
| 2015/0060027 | A1* | 3/2015 | Tawa | B21D 53/02 165/143 |
| 2015/0061111 | A1* | 3/2015 | Nagai | H01L 23/473 257/714 |
| 2015/0130302 | A1* | 5/2015 | Leberle | H02K 5/20 310/54 |
| 2015/0138730 | A1 | 5/2015 | Kuboto | |
| 2016/0088767 | A1* | 3/2016 | Kolstad | E21B 41/0007 361/699 |
| 2016/0143184 | A1* | 5/2016 | Campbell | H05K 7/20254 361/699 |
| 2017/0020027 | A1* | 1/2017 | Gao | H05K 7/2039 |
| 2017/0094837 | A1* | 3/2017 | Joshi | H05K 7/20327 |
| 2017/0213779 | A1* | 7/2017 | Ishiyama | H01L 23/4006 |
| 2017/0263533 | A1* | 9/2017 | Koyama | H01L 23/4006 |
| 2017/0271240 | A1* | 9/2017 | Inoue | H01L 23/473 |

FOREIGN PATENT DOCUMENTS

| | | |
|---|---|---|
| JP | 2005-302898 A | 10/2005 |
| JP | 2006-038302 A | 2/2006 |
| JP | 2008-034297 A | 2/2008 |
| JP | 2014-082283 A | 5/2014 |
| JP | 2014-116404 A | 6/2014 |
| WO | 2014/024291 A1 | 2/2014 |
| WO | 2014/027406 A1 | 2/2014 |

OTHER PUBLICATIONS

International Search Report issued in PCT/JP2015/051708; dated Apr. 21, 2015.
An Office Action mailed by the State Intellectual Property Office of the People's Republic of China dated Feb. 15, 2019, which corresponds to Chinese Patent Application No. 201580074270.X and is related to U.S. Appl. No. 15/533,394; with English translation.

* cited by examiner

SEMICONDUCTOR DEVICE

TECHNICAL FIELD

This invention relates to a semiconductor device applied to, for example, high-power switching.

BACKGROUND

Patent Document 1 discloses a heat conduction cooling device for cooling heat-generating bodies such as LSIs using cooling water. Patent Document 2 discloses a heatsink having protrusions for stirring a cooling fluid.

PRIOR ART

Patent Literature

Patent Literature 1: Japanese Patent Laid-Open No. H02-271560

Patent Literature 2: Japanese Patent Laid-Open No. 2005-302898

SUMMARY

Technical Problem

In the case where a plurality of semiconductor elements which generate heat are cooled with coolant, it is preferable that the temperature of a certain one of the semiconductor elements is prevented from becoming high and that variations in the temperatures of the semiconductor elements are reduced. However, for example, in the case where coolant used to cool a certain one of the semiconductor elements is used to cool another one, the semiconductor element cooled first is sufficiently cooled, but the semiconductor element cooled later is not sufficiently cooled. Accordingly, there has been a problem that variations in the temperatures of the semiconductor elements become large.

The present invention has been accomplished to solve the above-described problem, and an object of the present invention is to provide a semiconductor device which can reduce variations in the temperatures of a plurality of semiconductor elements.

Means for Solving the Problems

A semiconductor device according to the invention of the present application includes a cooling jacket having an inlet for coolant and an outlet for the coolant, a base plate, a first semiconductor element provided on the base plate, a second semiconductor element provided on the base plate, a first fin provided directly under the first semiconductor element on a back surface of the base plate and placed within the cooling jacket, a second fin provided directly under the second semiconductor element on the back surface of the base plate and placed within the cooling jacket, and a separator provided within the cooling jacket to divide the coolant entering the cooling jacket through the inlet into portions respectively cooling the first fin and the second fin.

Other features of the present invention will be revealed below.

Advantageous Effects of Invention

In this invention, unused coolant is supplied to each of a plurality of semiconductor elements. Accordingly, variations in the temperatures of the semiconductor elements can be reduced.

DESCRIPTION OF EMBODIMENTS

Semiconductor devices according to embodiments of the present invention will be described with reference to the drawings. The same or corresponding components will be denoted by the same reference signs, and the repetition of explanation thereof may be omitted.

Embodiment 1

Figure 1:
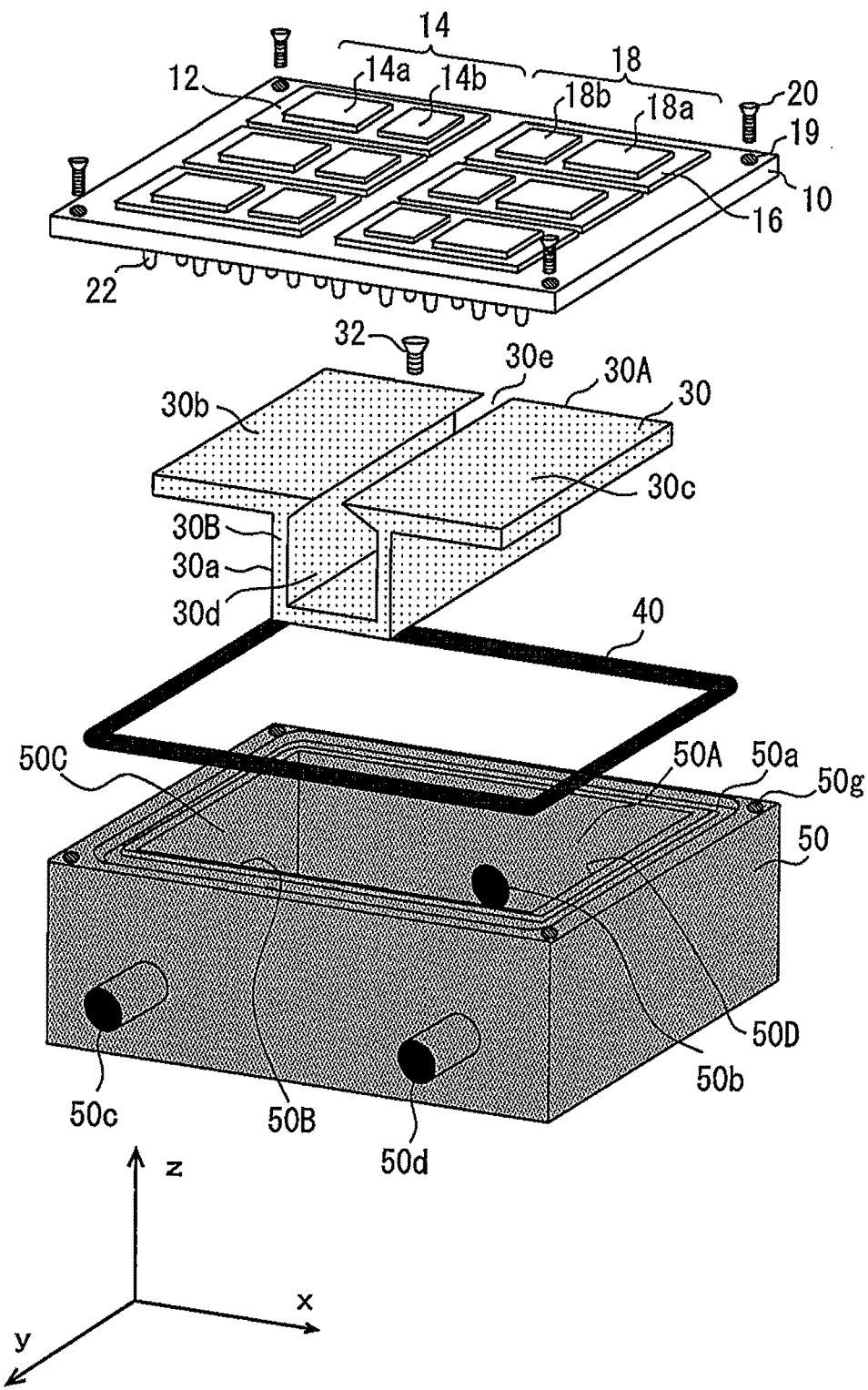
FIG. 1 is an exploded view of a semiconductor device according to Embodiment 1.

FIG. 1 is an exploded view of a semiconductor device according to Embodiment 1 of the present invention. This semiconductor device includes a base plate 10 made of metal. The base plate 10 has insulating substrates 12 and 16 provided thereon. There are three insulating substrates 12 arranged in the y direction and three insulating substrates 16 arranged in the y direction. Each of the insulating substrates 12 and 16 has metal patterns on upper and lower surfaces. The metal patterns on the lower surfaces of the insulating substrates 12 and 16 are fixed to the base plate 10 with solder. Semiconductor elements 14a and 14b are fixed to the metal patterns on the upper surfaces of the insulating substrates 12 with solder. The semiconductor elements 14a are, for example, IGBTs, and the semiconductor elements 14b are, for example, diodes. The three semiconductor elements 14a and the three semiconductor elements 14b are collectively referred to as a first semiconductor element 14.

Semiconductor elements 18a and 18b are fixed to the metal patterns on the upper surfaces of the insulating substrates 16 with solder. The semiconductor elements 18a are, for example, IGBTs, and the semiconductor elements 18b are, for example, diodes. The three semiconductor elements 18a and the three semiconductor elements 18b are collectively referred to as a second semiconductor element 18. In this way, the first semiconductor element 14 and the second semiconductor element 18 are provided on the base plate 10. The semiconductor device constitutes a three-phase AC inverter as a whole. The first semiconductor element 14 constitutes an upper arm element, and the second semiconductor element 18 constitutes a lower arm element.

The base plate 10 has through-holes 19 formed at four corners thereof. Screws 20 are inserted into the through-holes 19. The base plate 10 has fins 22 formed on a back surface thereof. The fins 22 are, for example, pin fins formed integrally with the base plate 10. The fins 22 may be parallel fins extending in the x direction. The fins 22 are provided over the entire back surface of the base plate 10, except edge portions of the base plate 10.

A separator 30 is disposed below the fins 22. The separator 30 is provided to lead coolant. The separator 30 includes a first guide portion 30a and second guide portions 30b and 30c. The first guide portion 30a is a U-tube extending in the y direction. The first guide portion 30a provides a flow path 30d extending in the y direction. The second guide portions 30b and 30c are plate-shaped members connected to upper ends of the first guide portion 30a. There is a gap 30e with a fixed width between the second guide portion 30b and the second guide portion 30c.

Edge portions in the negative y direction of the first guide portion 30a and the second guide portions 30b and 30c constitute one surface. This surface is referred to as a first contact surface 30A. Edge portions in the positive y direction of the first guide portion 30a and the second guide portions 30b and 30c constitute one surface. This surface is referred to as a second contact surface 30B.

A cooling jacket 50 is disposed below the separator 30. The cooling jacket 50 has a groove 50a formed in an upper surface thereof to receive part of an O-ring 40. The cooling jacket 50 has an inlet 50b for coolant and outlets 50c and 50d for coolant formed therein. A surface having the inlet 50b formed therein is referred to as a first surface 50A, and a surface having the outlets 50c and 50d formed therein is referred to as a second surface 50B. The first surface 50A and the second surface 50B face each other. The first surface 50A and the second surface 50B are connected with a third surface 50C and a fourth surface 50D.

The cooling jacket 50 has screw holes 50g provided at four corners thereof. The screws 20 passed through the through-holes 19 of the base plate 10 are screwed into the screw holes 50g to elastically deform the O-ring 40 sandwiched between the lower surface of the base plate 10 and the upper surface of the cooling jacket 50. The elastic deformation of the O-ring 40 can prevent coolant from leaking through a space between the base plate 10 and the cooling jacket 50.

Figure 2:
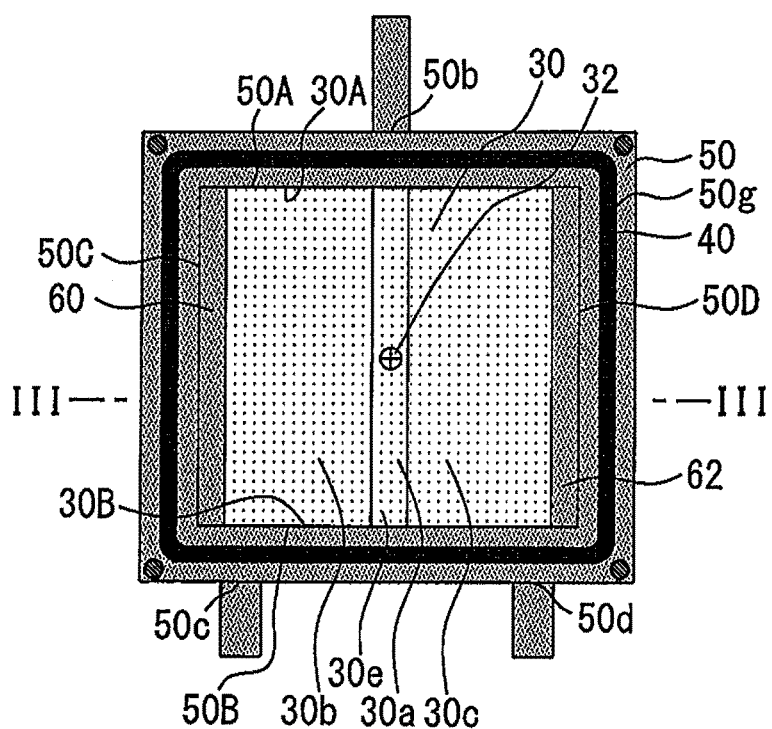
FIG. 2 is a plan view showing the cooling jacket and the separator.

FIG. 2 is a plan view showing the cooling jacket 50 and the separator 30 placed within the cooling jacket 50. The separator 30 is fixed to the cooling jacket 50 with screws 32. The first contact surface 30A of the separator 30 is in contact with the first surface 50A of the cooling jacket 50. The second contact surface 30B of the separator 30 is in contact with the second surface 50B of the cooling jacket 50. In other words, the first guide portion 30a and the second guide portions 30b and 30c are in contact with the first surface 50A and the second surface 50B.

A gap 60 is provided between the separator 30 (second guide portion 30b) and the third surface 50C of the cooling jacket 50. A gap 62 is provided between the separator 30 (second guide portion 30c) and the fourth surface 50D of the cooling jacket 50.

Figure 3:
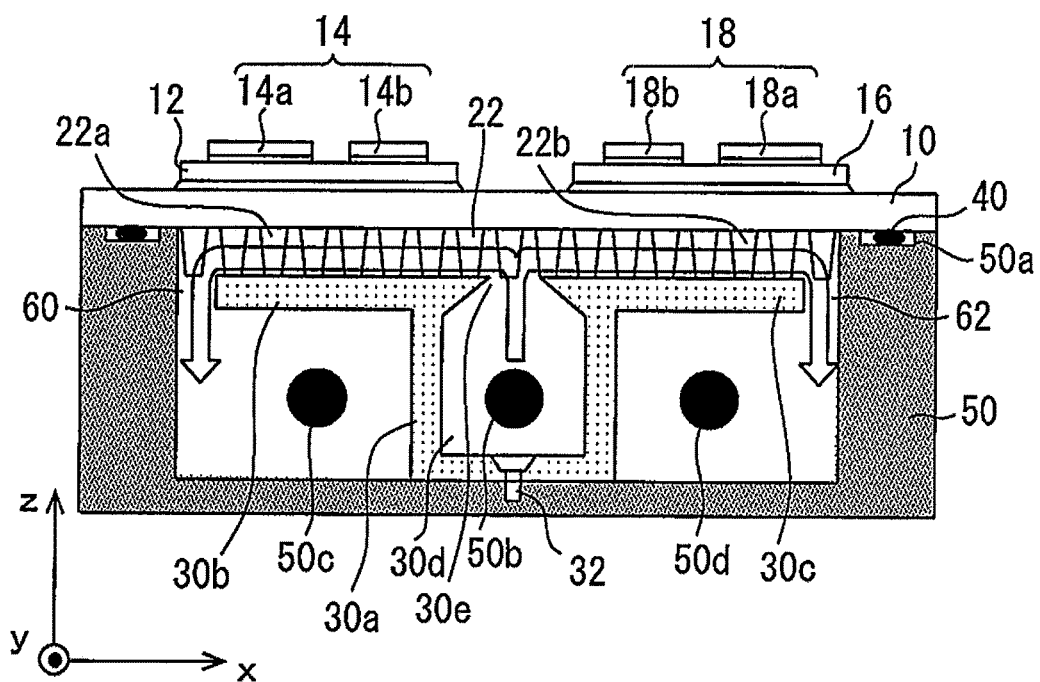
FIG. 3 is a cross-sectional view taken along line III-III in FIG. 2.

FIG. 3 is a cross-sectional view taken along line III-III in FIG. 2. FIG. 3 shows the base plate 10 and the semiconductor elements and the like fixed thereto, and further shows the inlet 50b and the outlets 50c and 50d. The fins 22 provided on a portion of the back surface of the base plate 10 which is directly under the first semiconductor element 14 are referred to as first fins 22a. The fins 22 provided on a portion of the back surface of the base plate 10 which is directly under the second semiconductor element 18 are referred to as second fins 22b. All of the fins 22, including the first fins 22a and the second fins 22b, are within the cooling jacket 50. Tips of the first fins 22a are in contact with the second guide portion 30b, and tips of the second fins 22b are in contact with the second guide portion 30c.

The flow of coolant will be described. The coolant entering through the inlet 50b is led into the flow path 30d formed by the first guide portion 30a. The coolant in the flow path 30d is led through the gap 30e to a space between the first fins 22a and the second fins 22b. Then, part of the coolant moves in the positive x direction, and other part of the coolant moves in the negative x direction. The coolant moving in the negative x direction passes through a space between the second guide portion 30b and the back surface of the base plate 10 to cool the first fins 22a. The coolant moving in the positive x direction passes through a space between the second guide portion 30c and the back surface of the base plate 10 to cool the second fins 22b. In this way, the second guide portions 30b and 30c lead the coolant between the first fins 22a and the second fins 22b toward the first fins 22a and the second fins 22b.

The coolant which has cooled the first fins 22a passes through the gap 60 and is discharged through the first outlet 50c. The coolant which has cooled the second fins 22b passes through the gap 62 and is discharged through the second outlet 50d. Since the first contact surface 30A and the second contact surface 30B of the separator 30 are respectively brought into contact with the first surface 50A and the second surface 50B of the cooling jacket 50, there is no other flow path than the above-described two flow paths.

Figure 4:
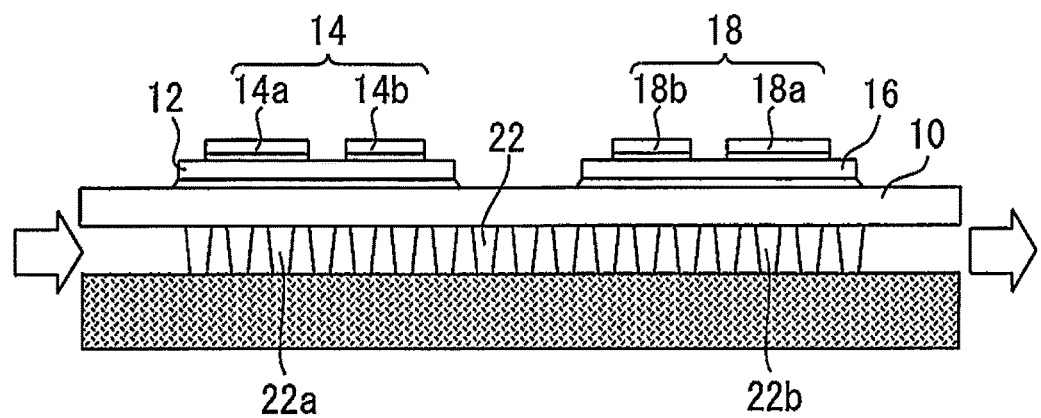
FIG. 4 is a cross-sectional view of a semiconductor device according to a comparative example.

To facilitate the understanding of features of the semiconductor device according to Embodiment 1 of the present invention, a comparative example will be described. FIG. 4 is a cross-sectional view of a semiconductor device according to a comparative example. In this semiconductor device, the coolant which has cooled the first fins 22a cools the second fins 22b. Accordingly, the second semiconductor element 18 is not sufficiently cooled. This makes the temperature of the second semiconductor element 18 higher than the temperature of the first semiconductor element 14.

Meanwhile, in the semiconductor device according to Embodiment 1 of the present invention, as shown in FIG. 3, the coolant entering the cooling jacket 50 through the single inlet 50b is divided into two parts by the separator 30, and the two parts cool the first fins 22a and the second fins 22b, respectively. Accordingly, the first semiconductor element 14 and the second semiconductor element 18 are always supplied with coolant having equal temperatures, and variations in the temperatures thereof can be reduced. In particular, in a semiconductor device in which upper and lower arms are used to enable inverter operation, the amounts of heat generated in the upper and lower arms are approximately equal. Thus, variations in the temperatures of the semiconductor elements can be reduced by supplying the first fins 22a and the second fins 22b with approximately equal amounts of coolant.

For example, a semiconductor device for a hybrid vehicle includes a protection system which individually monitors the temperatures of a plurality of semiconductor elements and which places a restriction on the load factor of the module (semiconductor device) if the temperature of one of the semiconductor elements exceeds a predetermined temperature. On-chip temperature sensors using diodes are often used to measure the temperatures of the semiconductor elements. In the case where the temperature of a certain one of the semiconductor elements becomes high as in the comparative example, the protection system frequently works, and the module cannot sufficiently exert the energizing capability thereof. In such a case, a load switch from motor drive to engine drive occurs earlier, and the improvement of the fuel efficiency of the vehicle is limited.

The semiconductor device according to Embodiment 1 of the present invention is particularly suitable for applications to such hybrid vehicles. The frequency of working of the protection system can be reduced by reducing variations in the temperatures of a plurality of semiconductor elements as in the semiconductor device of Embodiment 1. This makes it possible to reduce the energizing capability of the module, reduce the size of the module, and improve the fuel efficiency.

Since every part of the coolant is used to cool the first fins $22a$ or the second fins $22b$, the loss of the flow rate of the coolant can be eliminated. Since the separator 30 is fixed to the cooling jacket 50 with screws, the separator 30 can be prevented from being displaced within the cooling jacket 50.

Figure 5:
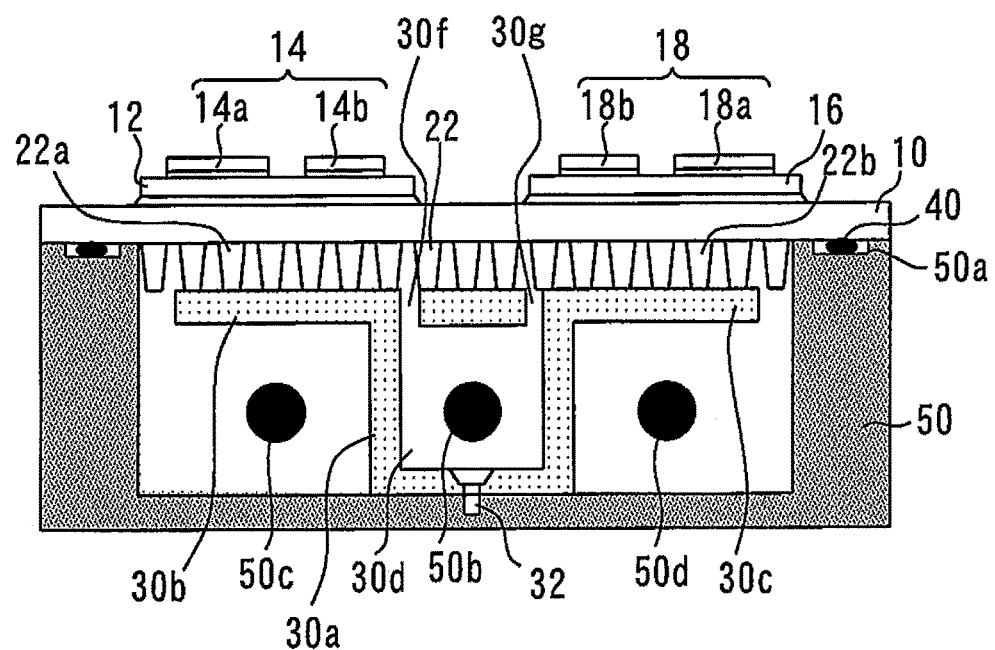
FIG. 5 is a cross-sectional view showing a separator and the like according to a modified example.
Figure 6:
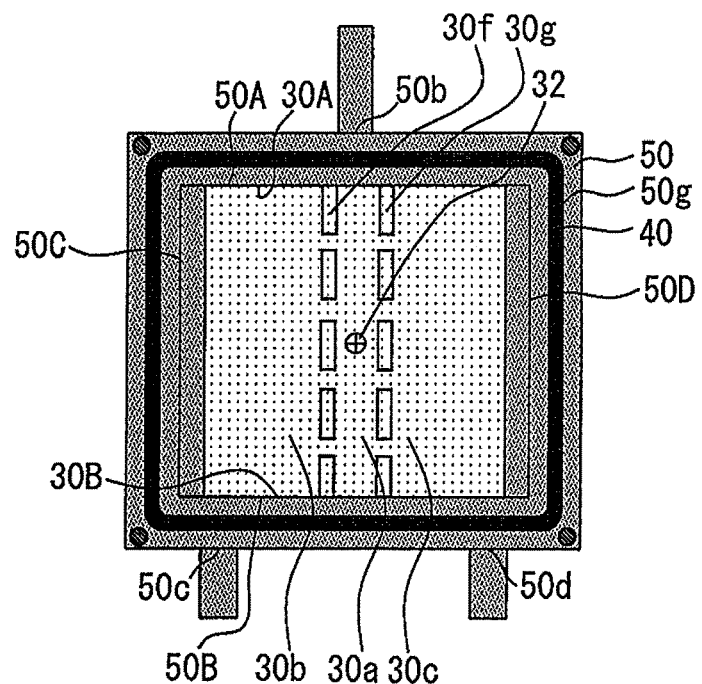
FIG. 6 is a plan view of the separator in FIG. 5.

The separator 30 may be any separator as long as the separator is provided within the cooling jacket 50 and divides the coolant entering the cooling jacket 50 through the inlet $50b$ into two parts which cool the first fins $22a$ and the second fins $22b$, respectively. The separator may have various shapes. FIG. 5 is a cross-sectional view showing a separator and the like according to a modified example. This separator has a first gap $30f$ for leading coolant toward the first fins $22a$ and a second gap $30g$ for leading coolant toward the second fins $22b$. FIG. 6 is a plan view of the separator in FIG. 5. It should be noted that the separator may include two or more components.

The number of outlets formed in the cooling jacket 50 is not limited to two. For example, the coolant which has passed through the gap 60 in FIG. 3 may be discharged through two outlets, and the coolant which has passed through the gap 62 may be discharged through two outlets. Moreover, while the tips of the first fins $22a$ and the tips of the second fins $22b$ are in contact with the second guide portions $30b$ and $30c$, there may be a slight gap therebetween. The first semiconductor element 14 and the second semiconductor element 18 may be any semiconductor elements which generate heat when currents are passed therethrough, and are not limited to IGBTs and diodes. Further, the number of elements constituting the first semiconductor element 14 and the number of elements constituting the second semiconductor element 18 are also not particularly limited.

These modifications can also be applied to semiconductor devices according to embodiments below. It should be noted that the semiconductor devices according to the embodiments below have many things in common with that of Embodiment 1, and therefore differences from Embodiment 1 will be mainly described.

Embodiment 2

Figure 7:
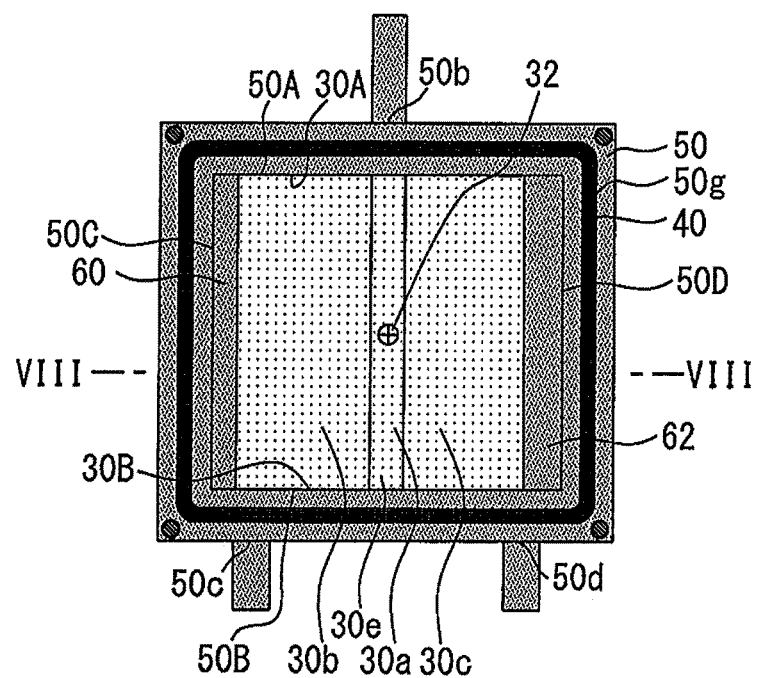
FIG. 7 is a plan view showing a cooling jacket and a separator of a semiconductor device according to Embodiment 2.
Figure 8:
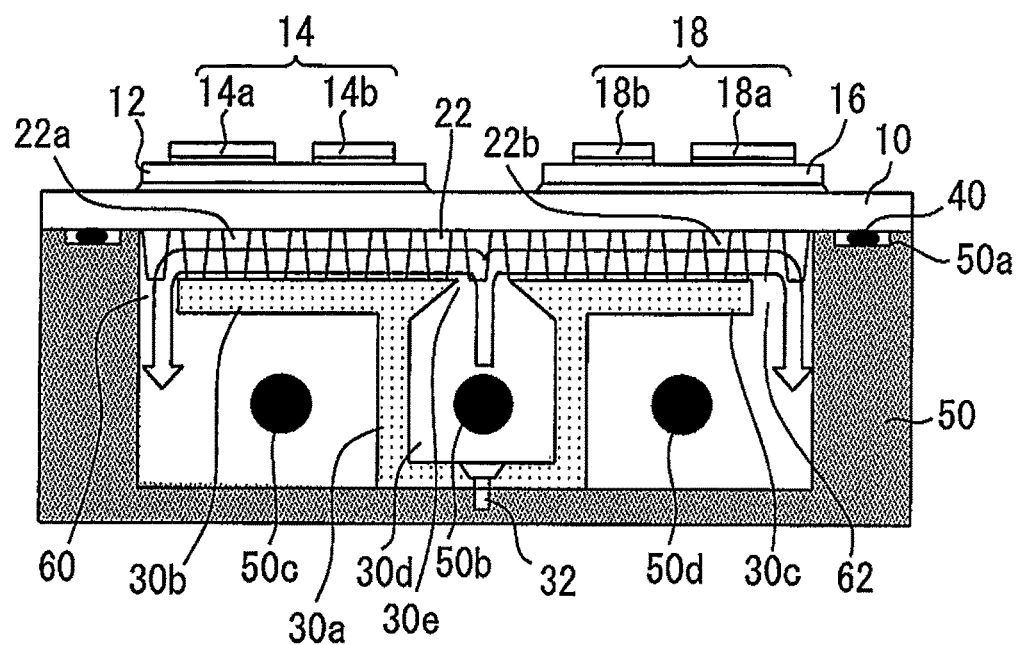
FIG. 8 is a cross-sectional view taken along line VIII-VIII in FIG. 7.

FIG. 7 is a plan view showing a cooling jacket and a separator of a semiconductor device according to Embodiment 2. The gap 62 has a larger width than that of the gap 60. FIG. 8 is a cross-sectional view taken along line VIII-VIII in FIG. 7. FIG. 8 shows a base plate and semiconductor elements and the like fixed thereto. Since the gap 62 has a larger width than that of the gap 60, the amount of the coolant supplied to the second fins $22b$ is larger than the amount of the coolant supplied to the first fins $22a$. Embodiment 2 of the present invention assumes that the amount of heat generated by the second semiconductor element 18 would be larger than the amount of heat generated by the first semiconductor element 14. The second semiconductor element 18 generating a large amount of heat is cooled by increasing the amount of the coolant supplied to the second fins $22b$. Thus, variations in the temperatures of the first semiconductor element 14 and the second semiconductor element 18 are reduced.

For example, during the voltage step-up energizing operation of a DC-DC converter, the element temperatures of lower arm IGBTs become higher than the element temperatures of upper arm diodes due to switching loss. In the case where an imbalance between the amounts of heat generated by elements of the upper and lower arms is known in advance as described above, variations in the temperatures of a plurality of semiconductor elements can be reduced by adjusting the widths of the gaps 60 and 62. It should be noted that the sizes of the gaps are appropriately optimized according to driving conditions of semiconductor elements.

To make the flow rate of the coolant for cooling the second fins $22b$ higher than the flow rate of the coolant for cooling the first fins $22a$, it is important that the width of the gap 62 is made larger than the width of the gap 60. The shape of the separator can be variously modified as long as the width of the gap 62 is larger than the width of the gap 60. For example, in the separator in FIG. 5, the width of the gap between the second guide portion $30c$ and the side surface of the cooling jacket 50 may be made larger than the width of the gap between the second guide portion $30b$ and the side surface of the cooling jacket 50. In that case, the width of the second gap $30g$ and the width of the first gap $30f$ do not necessarily have to be equal, and may be set freely.

Embodiment 3

Figure 9:
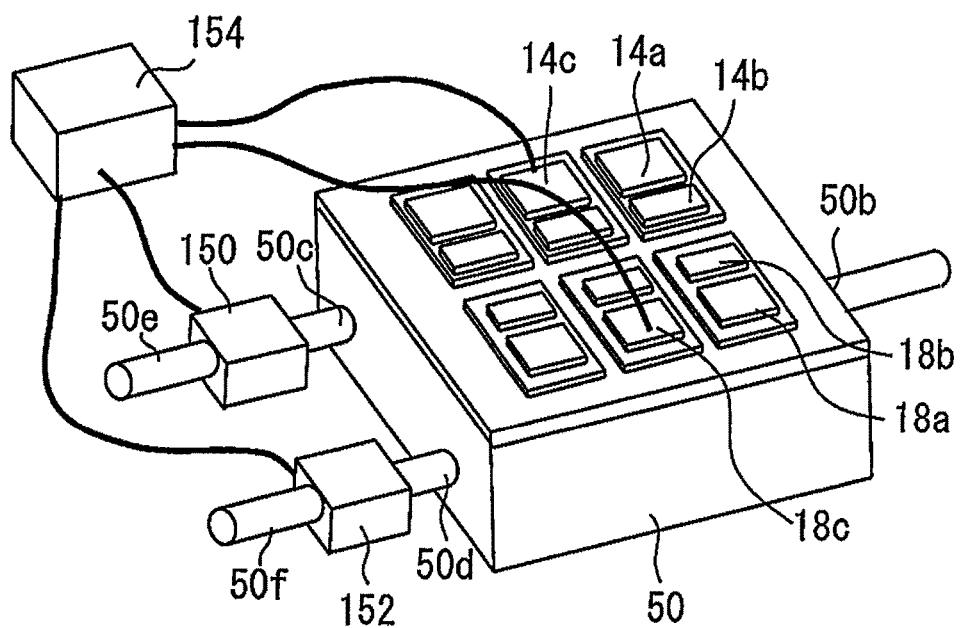
FIG. 9 is a perspective view of a semiconductor device according to Embodiment 3.

FIG. 9 is a perspective view of a semiconductor device according to Embodiment 3. The first semiconductor element 14 includes a semiconductor element $14c$ having an on-chip temperature sensor formed therein. A portion (on-chip sensor) of the first semiconductor element 14 which measures the temperature thereof is referred to as a first temperature measurement portion. The second semiconductor element 18 includes a semiconductor element $18c$ having an on-chip temperature sensor formed therein. A portion (on-chip sensor) of the second semiconductor element 18 which measures the temperature thereof is referred to as a second temperature measurement portion. The first temperature measurement portion and the second temperature measurement portion may be other constitution than on-chip temperature sensors.

A first regulator 150 is attached to a pipe $50e$ for leading to the outside the coolant discharged through the first outlet $50c$. The first regulator 150 adjusts the amount of the coolant discharged through the first outlet $50c$. A second regulator 152 is attached to a pipe $50f$ for leading to the outside the coolant discharged through the second outlet $50d$. The second regulator 152 adjusts the amount of the coolant discharged through the second outlet $50d$. A controller 154 for controlling the first regulator 150 and the second regulator 152 is connected to the first regulator 150 and the second regulator 152.

The controller 154 controls the first regulator 150 to increase the amount of the coolant discharged through the first outlet 50c if the temperature measured by the first temperature measurement portion is higher than the temperature measured by the second temperature measurement portion. Meanwhile, the controller 154 controls the second regulator 152 to increase the amount of the coolant discharged through the second outlet 50d if the temperature measured by the second temperature measurement portion is higher than the temperature measured by the first temperature measurement portion. This prevents the temperature of one semiconductor element from becoming higher than that of other semiconductor element and reduces variations in the temperatures of the semiconductor elements.

The controller 154 preferably controls the first regulator 150 and the second regulator 152 so that the sum of the amount of the coolant discharged through the first outlet 50c and the amount of the coolant discharged through the second outlet 50d may be maintained constant. In that case, both of the degree of opening of the first regulator 150 and that of the second regulator 152 are usually (at first) set to the same degree of opening not more than 100%. By maintaining the sum of the degrees of opening of the two regulators constant with the controller 154, a coolant pressure loss can be maintained constant. This makes it possible to avoid load changes on a pump for coolant caused by pressure loss changes and reduce failures of the pump.

Embodiment 4

Figure 10:
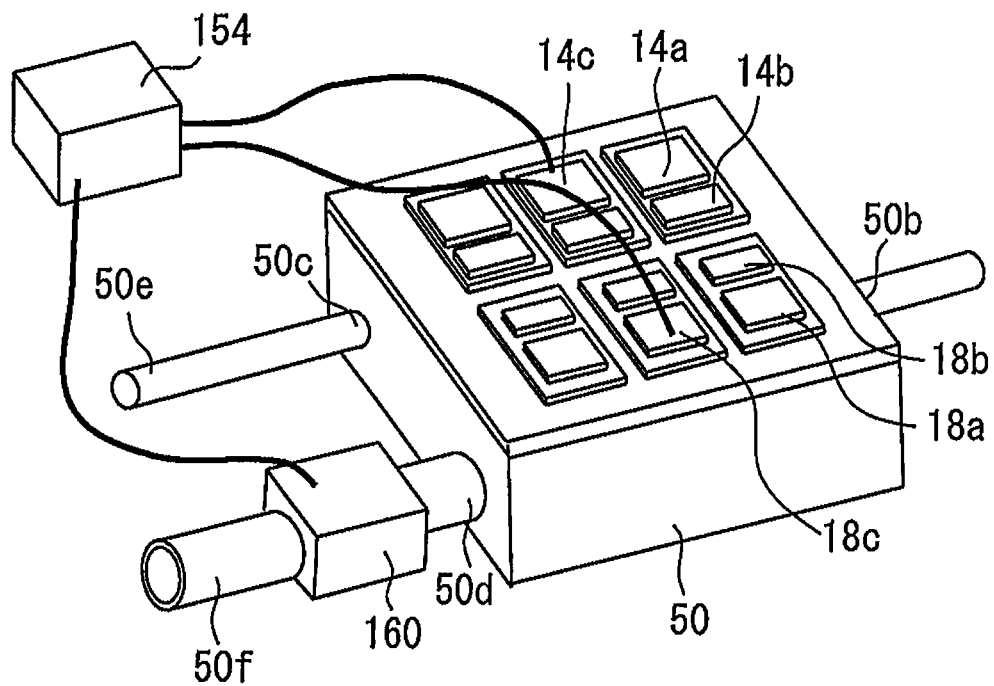
FIG. 10 is a perspective view of a semiconductor device according to Embodiment 4.

FIG. 10 is a perspective view of a semiconductor device according to Embodiment 4. The area of opening of the second outlet 50d is larger than the area of opening of the first outlet 50c. Along with this, the internal diameter of the pipe 50f is made larger than the internal diameter of the pipe 50e. The amount of the coolant discharged through the second outlet 50d is adjusted by the regulator 160. The controller 154 controls the regulator 160.

The controller 154 controls the regulator 160 to reduce the amount of the coolant discharged through the second outlet 50d if the temperature measured by the first temperature measurement portion is higher than the temperature measured by the second temperature measurement portion. This increases the amount of the coolant discharged through the first outlet 50c to accelerate the cooling of the first semiconductor element 14. Meanwhile, the controller 154 controls the regulator 160 to increase the amount of the coolant discharged through the second outlet 50d if the temperature measured by the second temperature measurement portion is higher than the temperature measured by the first temperature measurement portion. This accelerates the cooling of the second semiconductor element 18. Thus, variations in the temperatures of a plurality of semiconductor elements can be reduced by accelerating the cooling of a semiconductor element having a high temperature as described above.

The area of opening of the second outlet 50d is larger than the area of opening of the first outlet 50c. Along with this, the internal diameter of the pipe 50f is made larger than the internal diameter of the pipe 50e as shown in FIG. 10. Adjusting the regulator 160 attached to the large pipe 50f can largely change the flow rate. Accordingly, temperature variations can quickly be eliminated.

Figure 11:
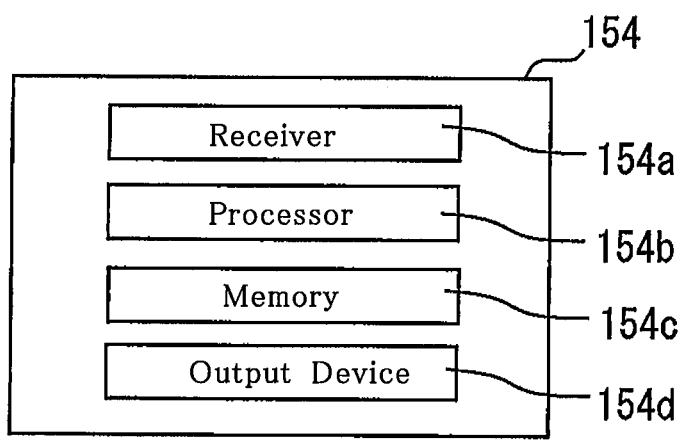
FIG. 11 is a diagram showing the hardware configuration of the controller.

The operation of the controller described in Embodiments 3 and 4 is executed by a processor in the controller. FIG. 11 is a diagram showing the hardware configuration of the controller. The controller 154 includes a receiver 154a for receiving information on temperatures measured by the first temperature measurement portion and the second temperature measurement portion. A processor 154b executes a program stored in memory 154c to determine details of control of a regulator 160 (in Embodiment 3, the first regulator 150 and the second regulator 152). The determined details of control are transmitted to the regulator by an output device 154d. It should be noted that the processor 154b is a processing circuit such as a CPU or a system LSI. The above-described functions may be executed by a plurality of processing circuits.

The area of opening of the second outlet 50d and the area of opening of the first outlet 50c may be equal. It should be noted that features of the semiconductor devices according to the above-described embodiments may appropriately be combined to improve effects of the present invention.

10 base plate, 14 first semiconductor element, 18 second semiconductor element, 22 fins, 22a first fins, 22b second fins, 30 separator, 50 cooling jacket, 150 first regulator, 152 second regulator, 154 controller, 160 regulator

The invention claimed is:

1. A semiconductor device comprising:
   a cooling jacket having an inlet for coolant and an outlet for the coolant;
   a base plate;
   a first semiconductor element provided on the base plate;
   a second semiconductor element provided on the base plate;
   a first fin provided directly under the first semiconductor element on a back surface of the base plate and placed within the cooling jacket;
   a second fin provided directly under the second semiconductor element on the back surface of the base plate and placed within the cooling jacket; and
   a separator provided within the cooling jacket, the separator having a first surface facing a first portion of the back surface of the base plate at which the first fin is provided, and a second surface facing a second portion of the back surface of the base plate at which the second fin is provided, and the separator being configured to divide the coolant entering the cooling jacket through the inlet into portions that pass through a first space between the first surface and the first portion of the back surface of the base plate past the first fin, and through a second space between the second surface and the second portion of the back surface of the base plate past the second fin, to respectively cool the first fin and the second fin,
   wherein the separator is a separate structure from the cooling jacket.

2. The semiconductor device according to claim 1, wherein the separator comprises:
   a first guide portion for leading the coolant entering through the inlet to a space between the first fin and the second fin; and
   a second guide portion for leading the coolant between the first fin and the second fin toward the first fin and the second fin.

3. The semiconductor device according to claim 2, wherein
   the outlet comprises a first outlet and a second outlet,
   the coolant cooling the first fin is discharged through the first outlet, and
   the coolant cooling the second fin is discharged through the second outlet.

4. The semiconductor device according to claim 3, further comprising:

a first temperature measurement portion for measuring temperature of the first semiconductor element;
a second temperature measurement portion for measuring temperature of the second semiconductor element;
a first regulator for adjusting an amount of the coolant discharged through the first outlet;
a second regulator for adjusting an amount of the coolant discharged through the second outlet; and
a controller for controlling the first regulator and the second regulator,
wherein the controller
controls the first regulator to increase the amount of the coolant discharged through the first outlet if the temperature measured by the first temperature measurement portion is higher than the temperature measured by the second temperature measurement portion, and
controls the second regulator to increase the amount of the coolant discharged through the second outlet if the temperature measured by the second temperature measurement portion is higher than the temperature measured by the first temperature measurement portion.

5. The semiconductor device according to claim 4, wherein the controller controls the first regulator and the second regulator so that a sum of the amount of the coolant discharged through the first outlet and the amount of the coolant discharged through the second outlet may be maintained constant.

6. The semiconductor device according to claim 3, further comprising:
a first temperature measurement portion for measuring temperature of the first semiconductor element;
a second temperature measurement portion for measuring temperature of the second semiconductor element;
a regulator for adjusting an amount of the coolant discharged through the second outlet; and
a controller for controlling the regulator,
wherein the controller
controls the regulator to reduce the amount of the coolant discharged through the second outlet if the temperature measured by the first temperature measurement portion is higher than the temperature measured by the second temperature measurement portion, and
controls the regulator to increase the amount of the coolant discharged through the second outlet if the temperature measured by the second temperature measurement portion is higher than the temperature measured by the first temperature measurement portion.

7. The semiconductor device according to claim 6, wherein an area of opening of the second outlet is larger than an area of opening of the first outlet.

8. The semiconductor device according to claim 2, wherein a tip of the first fin and a tip of the second fin are in contact with the second guide portion.

9. The semiconductor device according to claim 2, wherein
the cooling jacket has a first surface having the inlet formed therein and a second surface having the outlet formed therein and facing the first surface,
the first guide portion is in contact with the first surface and the second surface, and
the second guide portion is in contact with the first surface and the second surface.

10. The semiconductor device according to claim 2, wherein the second guide portion guides the portions of the coolant to flow in respective directions that are opposite to each other.

11. The semiconductor device according to claim 1, wherein the separator divides the coolant entering the cooling jacket through the inlet so that a flow rate of the coolant cooling the second fin becomes higher than a flow rate of the coolant cooling the first fin.

12. The semiconductor device according to claim 1, wherein the separator is configured to divide the coolant into portions that flow in respective directions that are transverse to a flow direction of the coolant entering the cooling jacket through the inlet and opposite to each other so that the portions respectively cool the first fin and the second fin.

13. A semiconductor device comprising:
a cooling jacket having an inlet for coolant and an outlet for the coolant, the outlet comprising a first outlet and a second outlet;
a base plate;
a first semiconductor element provided on the base plate;
a second semiconductor element provided on the base plate;
a first fin provided directly under the first semiconductor element on a back surface of the base plate and placed within the cooling jacket;
a second fin provided directly under the second semiconductor element on the back surface of the base plate and placed within the cooling jacket;
a separator provided within the cooling jacket to divide the coolant entering the cooling jacket through the inlet into portions respectively cooling the first fin and the second fin,
wherein
the coolant cooling the first fin is discharged through the first outlet,
the coolant cooling the second fin is discharged through the second outlet, and
the separator is a separate structure from the cooling jacket and comprises:
a first guide portion for leading the coolant entering through the inlet to a space between the first fin and the second fin; and
a second guide portion for leading the coolant between the first fin and the second fin toward the first fin and the second fin;
a first temperature measurement portion for measuring temperature of the first semiconductor element;
a second temperature measurement portion for measuring temperature of the second semiconductor element;
a first regulator for adjusting an amount of the coolant discharged through the first outlet;
a second regulator for adjusting an amount of the coolant discharged through the second outlet; and
a controller for controlling the first regulator and the second regulator,
wherein the controller
controls the first regulator to increase the amount of the coolant discharged through the first outlet if the temperature measured by the first temperature measurement portion is higher than the temperature measured by the second temperature measurement portion, and
controls the second regulator to increase the amount of the coolant discharged through the second outlet if the temperature measured by the second temperature measurement portion is higher than the temperature measured by the first temperature measurement portion.

14. The semiconductor device according to claim 13, wherein the controller controls the first regulator and the second regulator so that a sum of the amount of the coolant discharged through the first outlet and the amount of the coolant discharged through the second outlet may be maintained constant.

15. A semiconductor device comprising:
a cooling jacket having an inlet for coolant and an outlet for the coolant, the outlet comprising a first outlet and a second outlet;
a base plate;
a first semiconductor element provided on the base plate;
a second semiconductor element provided on the base plate;
a first fin provided directly under the first semiconductor element on a back surface of the base plate and placed within the cooling jacket;
a second fin provided directly under the second semiconductor element on the back surface of the base plate and placed within the cooling jacket;
a separator provided within the cooling jacket to divide the coolant entering the cooling jacket through the inlet into portions respectively cooling the first fin and the second fin,
wherein
the coolant cooling the first fin is discharged through the first outlet,
the coolant cooling the second fin is discharged through the second outlet, and
the separator is a separate structure from the cooling jacket and comprises:
a first guide portion for leading the coolant entering through the inlet to a space between the first fin and the second fin; and
a second guide portion for leading the coolant between the first fin and the second fin toward the first fin and the second fin;
a first temperature measurement portion for measuring temperature of the first semiconductor element;
a second temperature measurement portion for measuring temperature of the second semiconductor element;
a regulator for adjusting an amount of the coolant discharged through the second outlet; and
a controller for controlling the regulator,
wherein the controller
controls the regulator to reduce the amount of the coolant discharged through the second outlet if the temperature measured by the first temperature measurement portion is higher than the temperature measured by the second temperature measurement portion, and
controls the regulator to increase the amount of the coolant discharged through the second outlet if the temperature measured by the second temperature measurement portion is higher than the temperature measured by the first temperature measurement portion.

16. The semiconductor device according to claim 15, wherein an area of opening of the second outlet is larger than an area of opening of the first outlet.

* * * * *